United States Patent
Kuo et al.

(10) Patent No.: US 9,385,731 B2
(45) Date of Patent: Jul. 5, 2016

(54) PHASE-LOCKED LOOP (PLL)

(71) Applicant: Taiwan Semiconductor Manufacturing Company Limited, Hsin-Chu (TW)

(72) Inventors: Feng Wei Kuo, Zhudong Township (TW); Kuang-Kai Yen, Kaohsiung (TW); Huan-Neng Chen, Taichung (TW); Lee Tsung Hsiung, New Taipei (TW); Chewn-Pu Jou, Hsinchu (TW); Robert Bogdan Staszewski, Delft (NL)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 40 days.

(21) Appl. No.: 14/332,548

(22) Filed: Jul. 16, 2014

(65) Prior Publication Data

US 2016/0020775 A1  Jan. 21, 2016

(51) Int. Cl.
*H03L 7/06* (2006.01)
*H03L 7/093* (2006.01)
*H03L 7/095* (2006.01)

(52) U.S. Cl.
CPC ............... *H03L 7/093* (2013.01); *H03L 7/095* (2013.01); *H03L 2207/50* (2013.01)

(58) Field of Classification Search
CPC ....... H03L 7/0802; H03L 7/093; H03L 7/095; H03L 7/0992
USPC .................................. 327/147, 150, 156, 159
See application file for complete search history.

(56) References Cited

U.S. PATENT DOCUMENTS

| | | | | |
|---|---|---|---|---|
| 5,748,046 A | * | 5/1998 | Badger | H03J 1/005 329/308 |
| 6,396,353 B1 | * | 5/2002 | Krobel | H03L 7/095 327/156 |
| 6,476,681 B1 | * | 11/2002 | Kirkpatrick | H03L 7/093 331/1 A |
| 6,563,389 B1 | * | 5/2003 | Fischer | H03L 7/107 327/156 |
| 6,658,748 B1 | | 12/2003 | Leipold et al. | |
| 2002/0127988 A1 | * | 9/2002 | Humes | H03L 7/093 455/260 |
| 2003/0235262 A1 | * | 12/2003 | Staszewski | H03L 7/087 375/376 |
| 2011/0234324 A1 | | 9/2011 | Mei | |

* cited by examiner

*Primary Examiner* — William Hernandez
(74) *Attorney, Agent, or Firm* — Cooper Legal Group, LLC

(57) ABSTRACT

A phase-locked loop (PLL) is provided. The PLL comprises a clock adjuster configured to receive an initial clock signal having an initial frequency and a mode control signal. The clock adjuster is configured to modify the initial clock signal into a modified clock signal based on the mode control signal. The PLL is configured such that a loop bandwidth is equal to a specified bandwidth. When the modified clock signal is changed, a loop gain of a loop filter is adjusted such that the loop bandwidth is substantially equal to the specified bandwidth. When the modified clock signal is changed, an oscillator tuning word (OTW) signal is modified into a normalized OTW signal such that the loop bandwidth is substantially equal to the specified bandwidth.

20 Claims, 7 Drawing Sheets

PHASE-LOCKED LOOP (PLL)

BACKGROUND

A phase-locked loop (PLL) is a control system that is configured to output a signal having a phase that is related to an input signal.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
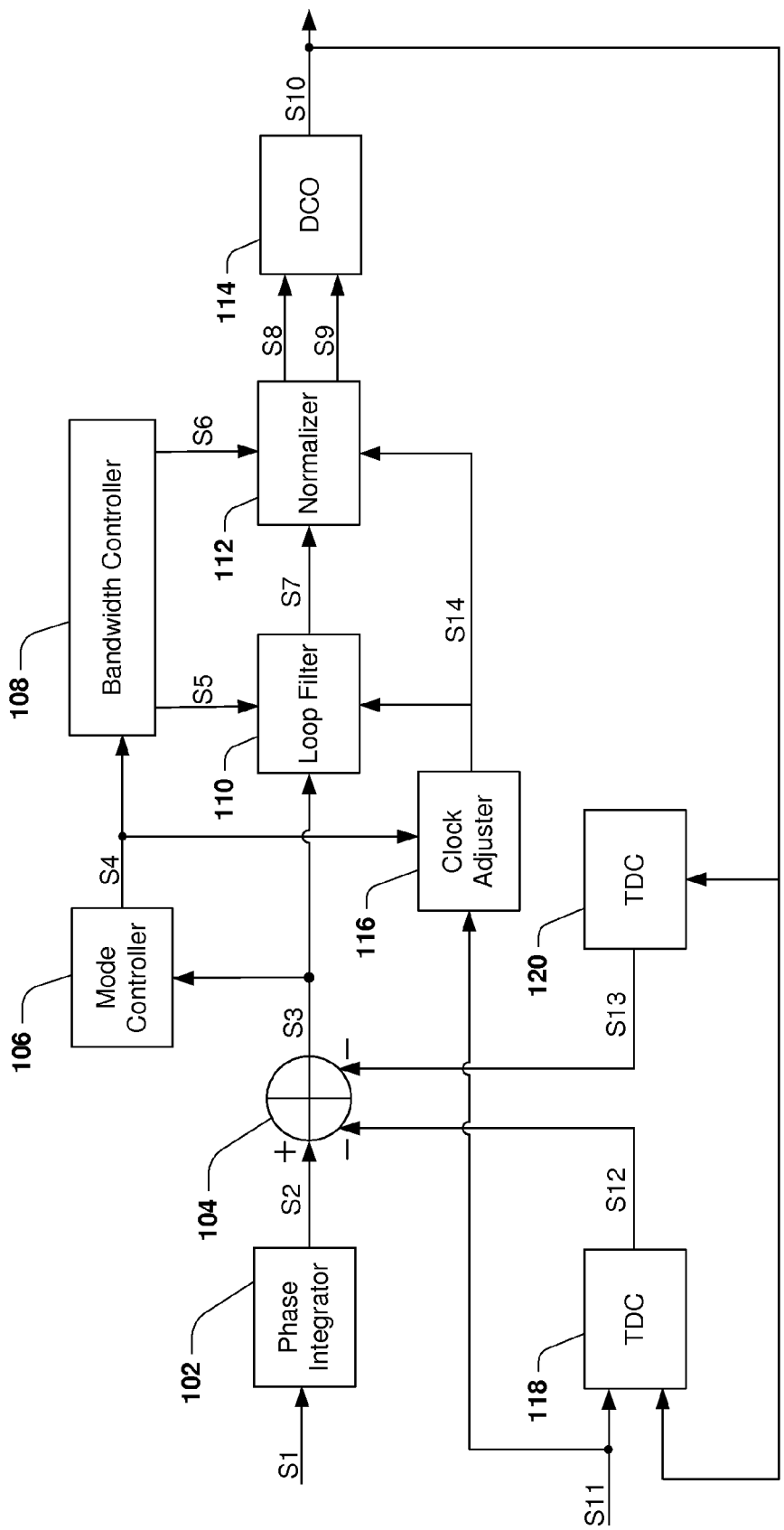
FIG. 1 is an illustration of a schematic block diagram, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In some embodiments, a phase-locked loop (PLL) is provided. In some embodiments, the PLL is an all-digital phase-locked loop (ADPLL). In some embodiments, the PLL is configured to generate an output clock signal at an output frequency substantially equal to a target frequency. In some embodiments, the target frequency is constant. In some embodiments, the target frequency changes from a first target frequency to a second target frequency, and the PLL is configured to change the output clock signal in accordance with the change to the target frequency. In some embodiments, the PLL is configured to change the output clock signal such that the output frequency is substantially equal to the second target frequency.

In some embodiments, an initial clock signal is received by a portion of the PLL. In some embodiments, the initial clock signal is generated by a signal generator. In some embodiments, a voltage of the initial clock signal forms a square wave. In some embodiments, the voltage of the initial clock signal changes between a first voltage level and a second voltage level. In some embodiments, a duty cycle of the initial clock signal is substantially equal to 50%. In some embodiments, the duty cycle of the initial clock signal is below 50%. In some embodiments, the duty cycle of the initial clock signal is above 50%. In some embodiments, the first voltage is substantially equal to 0 V. In some embodiments, the first voltage is above 0 V. In some embodiments, the first voltage is below 0 V. In some embodiments, the second voltage is above 3.3 V. In some embodiments, the second voltage is below 3.3 V. In some embodiments, the second voltage is substantially equal to 5 V. In some embodiments, the second voltage is substantially equal to 3.3 V. In some embodiments, the signal generator is configured to generate the initial clock signal having characteristics suitable for performance of the PLL.

In some embodiments, the signal generator is configured to generate the initial clock signal having characteristics suitable for performance of a device other than the PLL. In some embodiments, the initial clock signal has an initial frequency that is constant. In some embodiments, the initial frequency is below 100 MHz. In some embodiments, the initial frequency is substantially equal to 100 MHz. In some embodiments, the initial frequency is substantially equal to 880 MHz. In some embodiments, the initial frequency is between 100 MHz and 1 GHz. In some embodiments, the initial frequency is above 1 GHz. In some embodiments, the initial clock signal is used by the PLL to coordinate one or more operations to generate the output clock signal.

In some embodiments, the initial clock signal is used by the PLL to generate a first clock signal having a first frequency. In some embodiments, the initial clock signal is modified into the first clock signal. In some embodiments, a duty cycle of the first clock signal is substantially equal to 50%. In some embodiments, the duty cycle of the first clock signal is below 50%. In some embodiments, the duty cycle of the first clock signal is above 50%. In some embodiments, the first frequency is below the initial frequency. In some embodiments, the first frequency is substantially equal to the initial frequency. In some embodiments, the first frequency is above the initial frequency. In some embodiments, the first frequency corresponds to the initial frequency divided by a specified divisor. In some embodiments, the first frequency is substantially equal to the initial frequency divided by the specified divisor. In some embodiments, increasing the specified divisor results in the initial clock signal being modified into a second clock signal having a second frequency. In some embodiments, the first frequency is greater than the second frequency.

In some embodiments, a frequency command word (FCW) signal representing a FCW is received by a portion of the PLL. In some embodiments, the FCW corresponds to the target frequency. In some embodiments, a change of the FCW corresponds to a change to the target frequency. In some embodiments, the FCW is used by the PLL to calculate a reference phase related to the target frequency. In some embodiments, the initial clock signal is used by the PLL to coordinate operations in order to calculate the reference phase corresponding to the target frequency. In some embodiments, the initial clock signal is used by the PLL to coordinate operations in order to digitally represent the reference phase corresponding to the target frequency.

In some embodiments, the PLL is configured to become phase-locked. In some embodiments, the PLL is phase-locked when there is a constant relationship between an output phase and the reference phase. In some embodiments, the PLL is phase-locked when the output phase corresponds to the reference phase combined with a phase shift. In some embodiments, the PLL is phase-locked when the output phase is substantially equal to the reference phase combined with the phase shift. In some embodiments, the phase shift is substantially equal to 0 degrees. In some embodiments, the phase shift is substantially equal to 180 degrees. In some embodiments, the phase shift is below 180 degrees. In some embodiments, the phase shift is above 180 degrees. In some embodiments, when the PLL is phase-locked, the output frequency is substantially equal to the target frequency.

In some embodiments, the PLL is configured to operate such that a loop bandwidth of the PLL is substantially equal to a specified bandwidth. In some embodiments, the loop bandwidth is a closed-loop bandwidth of the PLL. In some embodiments, the PLL is configured to adjust the loop bandwidth when the loop bandwidth is not substantially equal to the specified bandwidth. In some embodiments, the loop bandwidth is a function of the first frequency when the first clock signal is generated. In some embodiments, the loop bandwidth is equal to a first loop bandwidth when the first clock signal is generated. In some embodiments, the loop bandwidth is a function of the second frequency when the second clock signal is generated. In some embodiments, the loop bandwidth is equal to a second loop bandwidth when the second clock signal is generated. In some embodiments, the first loop bandwidth is greater than the second loop bandwidth, if the first frequency is greater than the second frequency. In some embodiments, if the second frequency is substantially equal to half of the first frequency, the first loop bandwidth is two times greater than the second loop bandwidth.

In some embodiments, the loop bandwidth is a function of a parameter of a loop filter comprised in the PLL. In some embodiments, the parameter of the loop filter is programmable. In some embodiments, the loop bandwidth is a function of a loop gain of the loop filter. In some embodiments, the loop gain is programmable. In some embodiments, the loop bandwidth increases when the loop gain increases. In some embodiments, the loop bandwidth decreases when the loop gain decreases. In some embodiments, when the loop gain is halved, the loop bandwidth is halved. In some embodiments, when the loop gain is doubled, the loop bandwidth is doubled. In some embodiments, a change of the specified divisor from a first specified divisor to a second specified divisor causes a change of the loop bandwidth from the specified bandwidth to a third loop bandwidth. In some embodiments, in response to the change of the loop bandwidth, an adjustment of the loop gain occurs from a first loop gain to a second loop gain. In some embodiments, the loop bandwidth is substantially equal to the specified bandwidth when the specified divisor is the second specified divisor and the loop gain is the second loop gain. In some embodiments, in response to the change of the specified divisor the adjustment of the loop gain occurs in order to mitigate the change of the loop bandwidth such that the loop bandwidth is substantially equal to the specified bandwidth when the loop gain is the second loop gain.

FIG. 1 illustrates a schematic block diagram of a portion of a PLL, according to some embodiments. In some embodiments, the PLL comprises a phase integrator 102, a phase error circuit 104, a mode controller 106, a bandwidth controller 108, a loop filter 110, a normalizer 112, a digitally controlled oscillator (DCO) 114, a clock adjuster 116, a first portion of a time-to-digital convertor (TDC) 118 and a second portion of the TDC 120. In some embodiments, the phase integrator 102 is connected to the phase error circuit 104, which is connected to the first portion of the TDC 118 and to the second portion of the TDC 120. In some embodiments, an output of the phase error circuit 104 is connected to the mode controller 106 and to the loop filter 110. In some embodiments, an output of the mode controller 106 is connected to the clock adjuster 116 and to the bandwidth controller 108. In some embodiments, the loop filter 110 is connected to the bandwidth controller 108, to the clock adjuster 116 and to the normalizer 112. In some embodiments, the normalizer 112 is connected to the bandwidth controller 108, to the clock adjuster 116 and to the DCO 114. In some embodiments, the DCO 114 is connected to the first portion of the TDC 118 and to the second portion of the TDC 120. In some embodiments, the first portion of the TDC 118 is connected to the clock adjuster 116.

In some embodiments, the phase integrator 102 receives a FCW signal S1. In some embodiments, the phase integrator 102 is configured to use the FCW signal S1 to determine a reference phase. In some embodiments, the DCO 114 is configured to output an output clock signal S10 such that there is a constant phase difference between an output phase of the output clock signal S10 and the reference phase. In some embodiments, if there is a constant phase difference between the output phase and the reference phase, the output clock signal S10 has an output frequency that is substantially equal to a target frequency of the PLL. In some embodiments, the phase difference is substantially equal to 0 degrees. In some embodiments, the phase difference is substantially equal to a phase between 0 degrees and 360 degrees. In some embodiments, the phase integrator 102 outputs a reference phase signal S2 based on the reference phase.

In some embodiments, the first portion of the TDC 118 is configured to receive an initial clock signal S11 and the output clock signal S10. In some embodiments, the initial clock signal S11 is used by the first portion of the TDC 118 to coordinate one or more operations to generate a first output phase signal S12 representing an output phase fraction. In some embodiments, the output phase fraction is a calculation of a fractional part of the output phase. In some embodiments, the second portion of the TDC 120 is configured to receive the output clock signal S10. In some embodiments, the second portion of the TDC 120 is configured to generate a second output phase signal S13 representing an output phase integer. In some embodiments, the initial clock signal S11 is used by the second portion of the TDC 120 to coordinate one or more operations to generate the second output phase signal S13. In some embodiments, the output phase integer is a calculation of an integer part of the output phase.

In some embodiments, the phase error circuit 104 is configured to receive the reference phase signal S2, the first output phase signal S12 and the second output phase signal S13. In some embodiments, the phase error circuit 104 is configured to output a phase error signal S3 that represents a phase error. In some embodiments, the phase error corresponds to a difference between the output phase and the reference phase. In some embodiments, the phase error is substantially equal to the difference between the output phase and the reference phase. In some embodiments, the phase error circuit 104 is configured to subtract the output phase integer and the output phase fraction from the reference phase to determine the phase error. For example, when the output phase integer is 17 degrees, the output phase fraction is 0.7 degrees and the reference phase is 20 degrees, the phase error is equal to 20 degrees subtracted by a sum of 17 degrees and 0.7 degrees, which is 2.3 degrees.

In some embodiments, the mode controller 106 is configured to receive the phase error signal S3. In some embodiments, the mode controller 106 is configured to determine if the PLL is phase-locked. In some embodiments, the mode controller 106 is configured to generate a mode control signal S4 having a mode value. In some embodiments, the mode value indicates a mode of operation of the clock adjuster 116.

Figure 2:
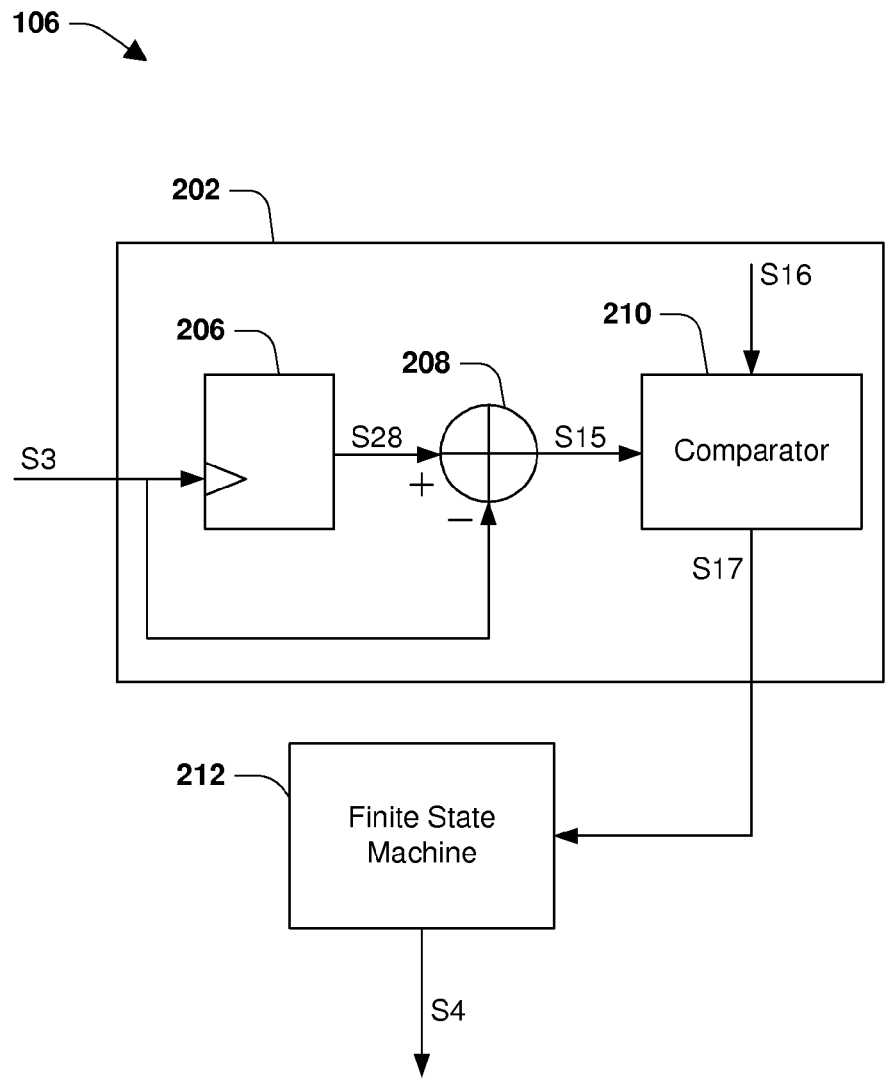
FIG. 2 is an illustration of a schematic block diagram, in accordance with some embodiments.

FIG. 2 illustrates a schematic block diagram of the mode controller 106, according to some embodiments. In some embodiments, the mode controller 106 comprises a lock-detection circuit 202 and a finite state machine 212. In some embodiments, the lock detection circuit 202 comprises a flip-flop 206, a subtractor 208 and a comparator 210. In some embodiments, the lock-detection circuit 202 is configured to detect whether the PLL is phase-locked. In some embodiments, the phase error signal S3 is received by the flip-flop 206 and by the subtractor 208. In some embodiments, the flip-flop 206 outputs a stored phase error signal S28 received by the subtractor 208. In some embodiments, the stored phase error signal S28 represents a stored phase error related to the phase error of a preceding clock cycle. In some embodiments, the subtractor 208 outputs a phase error change signal S15 having a phase error change value that corresponds to a difference between the phase error and the stored phase error. In some embodiments, the phase error change value is substantially equal to the difference between the phase error and the stored phase error. In some embodiments, the phase error change value decreases when the phase error decreases.

In some embodiments, the phase error change signal S15 is received by the comparator 210. In some embodiments, the comparator 210 is configured to receive a phase error threshold signal S16 having a specified threshold value. In some embodiments, the comparator 210 is configured to output a lock signal S17 having a lock value. In some embodiments, the comparator 210 is configured to output the lock signal S17 having a first value when the phase error change value is above the specified threshold value. In some embodiments, the comparator 210 is configured to output the lock signal S17 having a second value when the phase error change value is below the specified threshold value. In some embodiments, the lock signal S17 having the first value indicates that the PLL is not phase-locked. In some embodiments, the lock signal S17 having the second value indicates that the PLL is phase-locked. In some embodiments, the finite state machine 212 is configured to receive the lock signal S17. In some embodiments, the finite state machine 212 is configured to generate the mode control signal S4 based on the lock signal S17. In some embodiments, the finite state machine 212 is configured to change the mode value when the PLL becomes phase-locked.

In FIG. 1, in some embodiments, the clock adjuster 116 receives the initial clock signal S11. In some embodiments, the clock adjuster 116 receives the mode control signal S4. In some embodiments, the clock adjuster 116 is configured to modify the initial clock signal S11 to a modified clock signal S14 based on the mode control signal S4. In some embodiments, when the mode value is a first mode value, the modified clock signal S14 is a first clock signal with a first frequency. In some embodiments, when the mode value is a second mode value, the modified clock signal S14 is a second clock signal with a second frequency.

In some embodiments, a modified frequency of the modified clock signal S14 corresponds to an initial frequency of the initial clock signal S11 divided by a specified divisor. In some embodiments, the modified frequency of the modified clock signal S14 is substantially equal to the initial frequency of the initial clock signal S11 divided by the specified divisor. In some embodiments, the specified divisor corresponds to 2 to the power of the mode value. In some embodiments, the specified divisor is equal to 2 to the power of the mode value.

In this way, if the mode value is equal to 0, the modified frequency corresponds to the initial frequency, and if the mode value is equal to 1, the modified frequency corresponds to the initial frequency divided by 2. In some embodiments, if the mode value is equal to 0, the modified frequency is substantially equal to the initial frequency, and if the mode value is equal to 1, the modified frequency is substantially equal to the initial frequency divided by 2. In some embodiments, the loop filter 110 is configured to receive the modified clock signal S14. In some embodiments, the modified clock signal S14 is used to coordinate operations of the loop filter 110. In some embodiments, the modified clock signal S14 is used to coordinate operations of the normalizer 112. In some embodiments, the modified clock signal S14 is used to coordinate operations of the phase error circuit 104. In some embodiments, the modified clock signal S14 is used to coordinate operations of the bandwidth controller 108.

In some embodiments, the PLL is configured to inhibit a loop bandwidth of the PLL from changing from a specified bandwidth. In some embodiments, the loop bandwidth is a closed-loop bandwidth of the PLL. In some embodiments, a stability of the PLL corresponds to a stability of the loop bandwidth. In some embodiments, the stability of the PLL is increased when the stability of the loop bandwidth is increased.

In some embodiments, the loop filter 110 is configured to receive the phase error signal S3 and the modified clock signal S14. In some embodiments, the loop filter 110 is configured to generate a loop filter output signal. In some embodiments, the loop filter output signal is an oscillator tuning word (OTW) signal S7 digitally representing an OTW. In some embodiments, the OTW signal S7 is used by the DCO 114 to generate the output clock signal S10. In some embodiments, the loop bandwidth is a function of the OTW. In some embodiments, the OTW is a function of a parameter of the loop filter 110. In some embodiments, the OTW is a function of a loop gain. In some embodiments, the loop bandwidth is a function of the loop gain. In some embodiments, the loop gain is a gain of the loop filter 110. In some embodiments, the loop gain is programmable. In some embodiments, the loop gain is adjustable. In some embodiments, the OTW increases when the loop gain increases. In some embodiments, the loop bandwidth increases when the OTW increases. In some embodiments, the loop bandwidth increases when the loop gain increases. In some embodiments, the OTW decreases when the loop gain decreases. In some embodiments, the loop bandwidth decreases when the OTW decreases. In some embodiments, the loop bandwidth decreases when the loop gain decreases.

In some embodiments, the normalizer 112 is configured to receive the OTW signal S7. In some embodiments, the normalizer 112 is configured to modify the OTW signal S7 to a normalized OTW signal. In some embodiments, based on the modifying the OTW signal S7, an effect of a gain of the DCO 114 on the loop bandwidth is mitigated. In some embodiments, the normalizer 112 is configured to undergo a process-voltage-temperature (PVT) variation mode of operation to modify the OTW signal S7 into a first OTW signal S8. In some embodiments, the first OTW signal S8 represents a first normalized OTW. In some embodiments, the normalizer 112 is configured to undergo a tracking mode of operation to modify the OTW signal S7 into a second OTW signal S9. In some embodiments, the second OTW signal S9 represents a second normalized OTW.

In some embodiments, when the target frequency changes, the normalizer 112 undergoes the PVT variation mode of operation for a first period of time. In some embodiments, the normalizer 112 does not undergo the tracking mode of operation during the first period of time. In some embodiments, after the first period of time, the normalizer 112 undergoes the tracking mode of operation for a second period of time. In some embodiments, the normalizer 112 does not undergo the PVT variation mode of operation during the second period of time. In some embodiments, the second period of time begins when the PLL is phase-locked. In some embodiments, the second period of time begins before the PLL is phase-locked. In some embodiments, the DCO 114 uses the first OTW signal S8 during the first period of time. In some embodiments, the DCO 114 does not use the second OTW signal S9 during the first period of time. In some embodiments, the DCO 114 uses the second OTW signal S9 during the second period of time. In some embodiments, the DCO 114 does not use the first OTW signal S8 during the second period of time.

In some embodiments, the bandwidth controller 108 is configured to receive the mode control signal S4. In some embodiments, the bandwidth controller 108 is configured to calculate a bandwidth control value that is indicative of a loop filter gain that results in the closed-loop bandwidth of the PLL changing to the specified bandwidth. In some embodiments, the bandwidth controller 108 is configured to generate a first bandwidth control signal S5 representing the bandwidth control value. In some embodiments, the bandwidth controller 108 is configured to calculate an estimated DCO gain value that is an estimation of the gain of the DCO 114. In some embodiments, the bandwidth controller 108 is configured to generate a second bandwidth control signal S6. In some embodiments, the second bandwidth control signal S6 represents the estimated DCO gain value. In some embodiments, the second bandwidth control signal S6 is used by the normalizer 112 to modify the OTW signal S7 to the normalized OTW signal.

In some embodiments, a change in the modified frequency causes a change in the loop bandwidth. In some embodiments, the loop bandwidth is a function of the modified frequency. In some embodiments, the loop bandwidth increases when the modified frequency increases. In some embodiments, the loop bandwidth decreases when the modified frequency decreases.

In some embodiments, the mode value is an integer. In some embodiments, the mode value is a first mode value. In some embodiments, the first mode value is 0. In some embodiments, when the mode value is the first mode value, the modified frequency is a first frequency. In some embodiments, the first frequency corresponds to the initial frequency. In some embodiments, the first frequency is substantially equal to the initial frequency. In some embodiments, the mode value changes to a second mode value. In some embodiments, the second mode value is 1. In some embodiments, when the mode value is the second mode value, the modified frequency is a second frequency. In some embodiments, the second frequency corresponds to the initial frequency divided by 2. In some embodiments, the second frequency is substantially equal to the initial frequency divided by 2. In some embodiments, the mode value changes to a third mode value. In some embodiments, the third mode value is 2. In some embodiments, when the mode value is the third mode value, the modified frequency is a third frequency. In some embodiments, the third frequency corresponds to the initial frequency divided by 4. In some embodiments, when the third frequency is substantially equal to the initial frequency divided by 4. In some embodiments, the mode value changes to a fourth mode value. In some embodiments, the fourth mode value is 3. In some embodiments, when the mode value is the fourth mode value, the modified frequency is a fourth frequency. In some embodiments, the fourth frequency corresponds to the initial frequency divided by 8. In some embodiments, the fourth frequency is substantially equal to the initial frequency divided by 8. In some embodiments, the mode value changes to a fifth mode value. In some embodiments, the fifth mode value is 4. In some embodiments, when the mode value is the fifth mode value, the modified frequency is a fifth frequency. In some embodiments, the fifth frequency corresponds to the initial frequency divided by 16. In some embodiments, the fifth frequency is substantially equal to the initial frequency divided by 16. In some embodiments, the fifth mode value is a maximum mode value. In some embodiments, the maximum mode value is greater than the fifth mode value. In some embodiments, the maximum mode value is less than the fifth mode value. In some embodiments, the mode value does not exceed the maximum mode value.

In some embodiments, the loop bandwidth is substantially equal to the specified bandwidth when the mode value is a first mode value. In some embodiments, if the mode value is changed to a second mode value, the loop bandwidth changes from the specified bandwidth to a first loop bandwidth. In some embodiments, the second mode value is equal to a sum of 1 and the first mode value. In some embodiments, the first loop bandwidth is substantially equal to half of the specified bandwidth. In some embodiments, responsive to the mode value being changed, the loop gain is adjusted from a first loop gain to a second loop gain. In some embodiments, the second loop gain is equal to 2 multiplied by the first loop gain. In some embodiments, after the loop gain is adjusted to the second loop gain, the loop bandwidth is substantially equal to the specified bandwidth. In some embodiments, the mode value being increased causes the loop bandwidth to decrease from the specified bandwidth to a second loop bandwidth. In some embodiments, the second loop bandwidth is less than the specified bandwidth. In some embodiments, responsive to the mode value being incremented, the loop gain is increased from the second loop gain to a third loop gain. In some embodiments, after the loop gain is increased to the third loop gain, the loop bandwidth is substantially equal to the specified bandwidth.

In some embodiments, if the mode value is incremented, the modified frequency decreases by a factor of a specified number to a first frequency. In some embodiments, when the modified frequency decreases to the first frequency, the loop bandwidth at the specified bandwidth decreases by a factor of the specified number to a third loop bandwidth. In some embodiments, responsive to the modified frequency decreasing to the first frequency, the loop gain is increased by a factor of the specified number to a fourth loop gain. In some embodiments, the specified number is substantially equal to 2. In some embodiments, after the mode value is incremented and the loop gain is increased to the fourth loop gain, the loop bandwidth is substantially equal to the specified bandwidth. In some embodiments, if the mode value is decreased to a third mode value, the loop bandwidth increases to a fourth loop bandwidth. In some embodiments, after the mode value is decreased, the loop gain is decreased to a fifth loop gain. In some embodiments, after the loop gain is decreased to the fifth loop gain, the loop bandwidth is substantially equal to the specified bandwidth.

In some embodiments, the loop gain is not adjustable. In some embodiments, when the loop gain is not adjustable, the OTW signal S7 is based on the modified frequency. In some embodiments, when the loop gain is not adjustable, the loop bandwidth is based on a normalized OTW signal used by the DCO 114. In some embodiments, the normalizer 112 is configured to modify the OTW signal S7 to the normalized OTW signal. In some embodiments, the effect of the gain of the DCO 114 on the loop bandwidth is mitigated based on the modification of the OTW signal S7 to the normalized OTW signal. In some embodiments, the loop bandwidth is substantially equal to the specified bandwidth based on the modification of the OTW signal S7 to the normalized OTW signal.

In some embodiments, the normalizer 112 is configured to modify the OTW signal S7 to the normalized OTW signal based on a change of the mode value. In some embodiments, the loop bandwidth is substantially equal to the specified bandwidth when the mode value is constant for a period of time. In some embodiments, if the mode value is changed from a first mode value to a second mode value, the OTW of the OTW signal S7 is changed. In some embodiments, based on the modifying the OTW signal S7 to the normalized OTW signal, the loop bandwidth is substantially equal to the specified bandwidth. In some embodiments, the first mode value is less than the second mode value. In some embodiments, the second mode value is equal to a sum of 1 and the first mode value. In some embodiments, when the mode value is changed from the first mode value to the second mode value, the OTW changes from a first OTW to a second OTW. In some embodiments, the second OTW is less than the first OTW. In some embodiments, the second OTW is half of the first OTW.

In some embodiments, the OTW changing to the second OTW corresponds to the loop bandwidth changing from the specified bandwidth to a first loop bandwidth. In some embodiments, the first loop bandwidth is less than the specified bandwidth. In some embodiments, the first loop bandwidth is half of the specified bandwidth. In some embodiments, the normalizer 112 modifies the OTW signal S7 to the normalized OTW signal corresponding to the loop bandwidth substantially equal to the specified bandwidth. In some embodiments, a normalized OTW of the normalized OTW signal corresponds to the OTW multiplied by a number. In some embodiments, a normalized OTW of the normalized OTW signal is substantially equal to the OTW multiplied by the number. In some embodiments, the number is an integer. In some embodiments, the number is a multiple of two. In some embodiments, the number not an integer. In some embodiments, the number is less than one. In some embodiments, the number is greater than zero.

Figure 3:
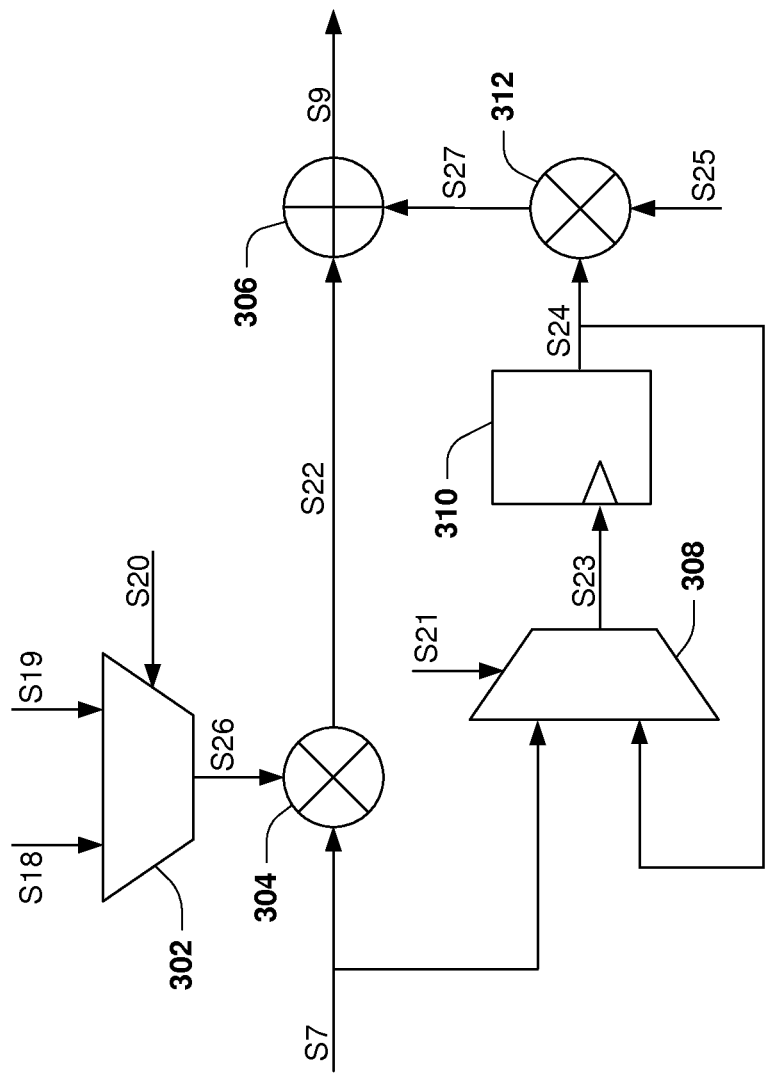
FIG. 3 is an illustration of a schematic block diagram, in accordance with some embodiments.

A portion of the normalizer 112 is illustrated in FIG. 3, according to some embodiments where the loop gain is not adjustable and the normalizer 112 is configured to modify the OTW signal S7 to the normalized OTW signal such that the loop bandwidth is substantially equal to the specified bandwidth. In some embodiments, the normalizer 112 comprises a first multiplexer 302, a second multiplexer 308, a first multiplier 304, a second multiplier 312, an adder 306 and a flip-flop 310. In some embodiments, the flip-flop 310 is a D flip-flop. In some embodiments, the first multiplexer 302 is configured to receive a first normalizer signal S18, a second normalizer signal S19 and a first multiplexer control signal S20. In some embodiments, the first normalizer signal S18 is generated by a portion of the PLL. In some embodiments, the second normalizer signal S19 is generated by a portion of the PLL. In some embodiments, the first multiplexer control signal S20 is generated by a portion of the PLL. In some embodiments, the second multiplexer 308 is configured to receive the OTW signal S7, a flip-flop output signal S24 and a second multiplexer control signal S21. In some embodiments, the second multiplexer control signal S21 is generated by a portion of the PLL. In some embodiments, the second multiplier 312 is configured to receive a third normalizer signal S25 generated by a portion of the PLL.

In some embodiments, the first normalizer signal S18 represents the estimated DCO gain value of the second bandwidth control signal S6 described in association with FIG. 1. In some embodiments, the second normalizer signal S19 represents the estimated DCO gain value multiplied by a division ratio. In some embodiments, a change of a mode value from a first mode value to a second mode value corresponds to a change of the modified frequency from a first frequency to a second frequency. In some embodiments, the division ratio corresponds to the second frequency divided by the first frequency. In some embodiments, the division ratio is substantially equal to second frequency divided by the first frequency.

In some embodiments, responsive to the change of the mode value, the first multiplexer control signal S20 changes. In some embodiments, the first multiplexer 302 is configured to generate a first multiplexer output signal S26 based on the first normalizer signal S18, the second normalizer signal S19 and the first multiplexer control signal S20. In some embodiments, the first multiplier 304 is configured to generate a first multiplier output signal S22 based on at least one of the first multiplexer output signal S26 or the OTW signal S7. In some embodiments, the first multiplier 304 is configured to multiply the first multiplexer output signal S26 with the OTW signal S7 to generate the first multiplier output signal S22.

In some embodiments, the third normalizer signal S25 is based on at least one of the estimated DCO gain value or the division ratio. In some embodiments, the third normalizer signal S25 represents the estimated DCO gain value multiplied by a difference between the division ratio and 1. In some embodiments, responsive to the change of the mode value, the second multiplexer control signal S21 changes. In some embodiments, the second multiplexer 308 is configured to generate a second multiplexer output signal S23 based on at least one of the OTW signal S7, the flip-flop output signal S24 or the second multiplexer control signal S21. In some embodiments, the flip-flop 310 is configured to generate the flip-flop output signal S24 based on the second multiplexer output signal S23 during a previous clock cycle. In some embodiments, the second multiplier 312 is configured to generate a second multiplier output signal S27 based on at least one of the flip-flop output signal S24 or the third normalizer signal S25. In some embodiments, the second multiplier 312 is configured to multiply the flip-flop output signal S24 with the third normalizer signal S25 to generate the second multiplier output signal S27.

In some embodiments, the adder 306 is configured to generate the second OTW signal S9 based on at least one of the first multiplier output signal S22 or the second multiplier output signal S27. In some embodiments, the adder 306 is configured to add the first multiplier output signal S22 and the second multiplier output signal S27 to generate the second OTW signal S9. In some embodiments, if there is a change in the OTW signal S7 from a first OTW to a second OTW due to the change of the mode value, the second OTW signal S9 does not change and is equal to the first OTW.

Figure 4:
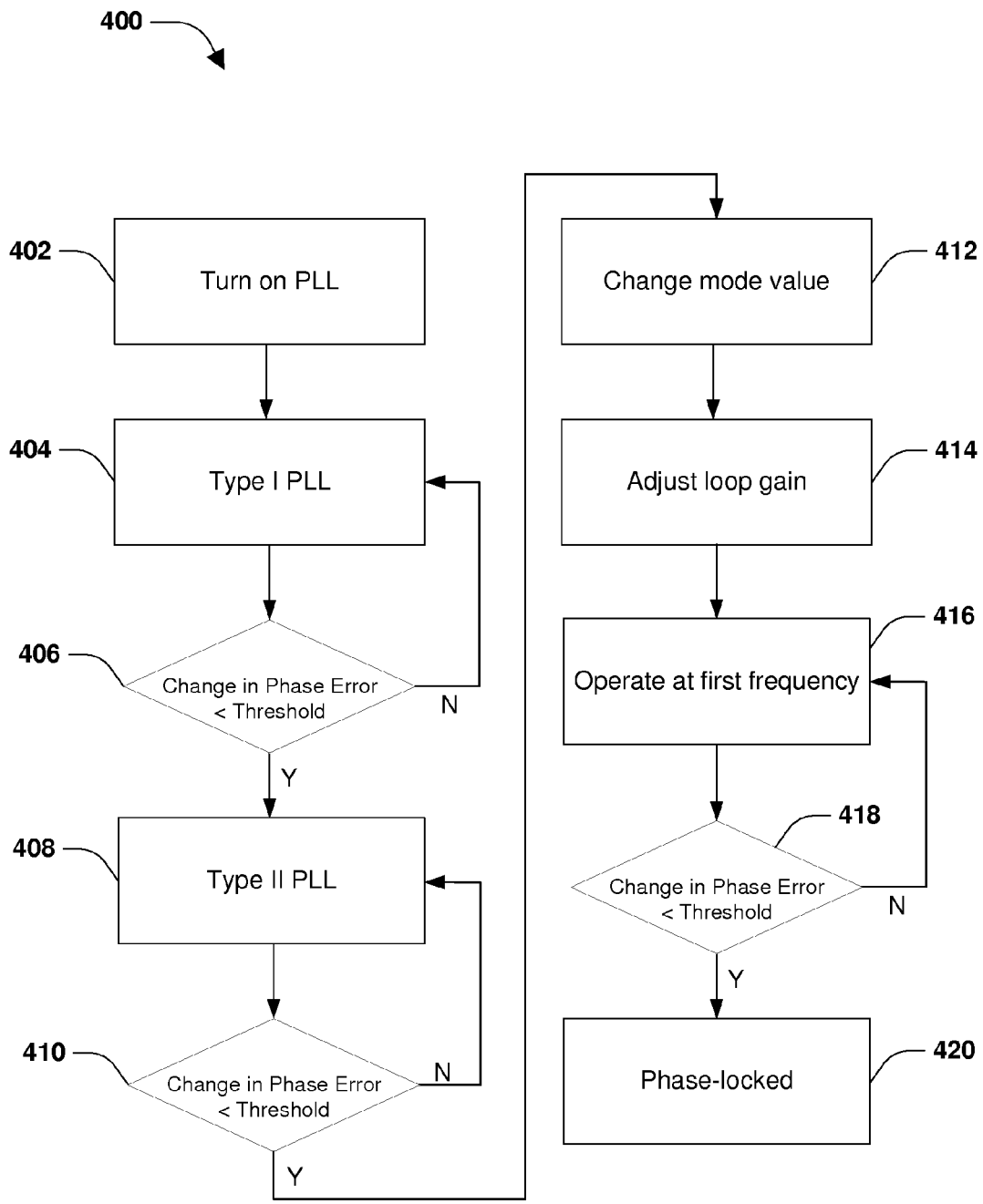
FIG. 4 illustrates a method of operating a PLL, in accordance with some embodiments.

A method 400 of operating a PLL is illustrated in FIG. 4, according to some embodiments. In some embodiments, at 402, responsive to an FCW signal being set to an FCW corresponding to a target frequency, a voltage is supplied to one or more portions of the PLL, such that the PLL is turned on. In some embodiments, at 404, the PLL operates using a type-I PLL configuration that is a first-order control system configuration. In some embodiments, at 406, a change in a phase error is compared with a phase error threshold, the phase error corresponding to a difference between a reference phase and an output phase of an output clock signal of the PLL. In some embodiments, the PLL operates using the type-I PLL configuration until a magnitude of the change of the phase error is below the phase error threshold.

In some embodiments, at 406, a lock signal is set to a second value indicating that the PLL is phase-locked when the magnitude of the change of the phase error is below the phase error threshold. In some embodiments, if the change in the phase error is not less than the phase error threshold, then 404 is repeated. In some embodiments, if the change in the phase error is less than the phase error threshold, then at 408, the PLL operates using a type-II PLL configuration that is a second-order control system configuration. In some embodiments, at 410, the change in the phase error is compared with the phase error threshold and the lock signal is set to the second value when the magnitude of the change in the phase error is below the phase error threshold. In some embodiments, if the change in the phase error is not less than the phase error threshold, then 408 is repeated.

In some embodiments, if the change in the phase error is less than the phase error threshold, then at 412, a mode value is increased from a first mode value to a second mode value and a clock adjuster modifies an initial clock signal with an initial frequency to a modified clock signal having a modified frequency substantially equal to a first frequency. In some embodiments, the modified frequency corresponds to the initial frequency divided by a specified divisor. In some embodiments, the modified frequency is equal to the initial frequency divided by the specified divisor. In some embodiments, the specified divisor corresponds to 2 to the power of the mode value. In some embodiments, the specified divisor is equal to 2 to the power of the mode value. In some embodiments, the first mode value is equal to 0. In some embodiments, the second mode value is equal to 1. In some embodiments, the first frequency corresponds to the initial frequency divided by 2 to the power of the second mode value. In some embodiments, the first frequency is equal to the initial frequency divided by two.

In some embodiments, responsive to the mode value changing, a normalized OTW is adjusted by a normalizer. In some embodiments, based on adjusting the normalized OTW by the normalizer, a loop bandwidth is substantially equal to a specified bandwidth. In some embodiments, at 414, responsive to the mode value changing, a loop gain is adjusted to a first loop gain. In some embodiments, based on adjusting the loop gain, the loop bandwidth is substantially equal to the specified bandwidth. In some embodiments, at 416, the PLL operates with the modified frequency substantially equal to the first frequency and the loop bandwidth substantially equal to the specified bandwidth. In some embodiments, at 418, the change in the phase error is compared with the phase error threshold and the lock signal is set to the second value when the magnitude of the change in the phase error is below the phase error threshold. In some embodiments, if the change in the phase error is not less than the phase error threshold, then 416 is repeated. In some embodiments, if the change in the phase error is less than the phase error threshold, then at 420, the PLL is phase-locked. In some embodiments, after the lock signal is set to the second value, if the mode value is a maximum mode value, the PLL is configured to continue operation with the modified frequency substantially equal to the first frequency.

In some embodiments, if the mode value is below the maximum mode value, the mode value is increased to a third mode value, and the clock adjuster modifies the initial clock signal to a second clock signal having a second frequency. In some embodiments, the second frequency corresponds to the initial frequency divided by a second specified divisor. In some embodiments, the second specified divisor is the same as the specified divisor. In some embodiments, the second specified divisor is different than the specified divisor. In some embodiments, the second frequency is equal to the initial frequency divided by the second specified divisor. In some embodiments, the second specified divisor corresponds to 2 to the power of the third mode value. In some embodiments, the second specified divisor is equal to 2 to the power of the third mode value. In some embodiments, responsive to the mode value changing, the normalized OTW is adjusted by the normalizer. In some embodiments, based on adjusting the normalized OTW by the normalizer, the loop bandwidth is substantially equal to the specified bandwidth. In some embodiments, responsive to the mode value changing, the loop gain is adjusted to a second loop gain. In some embodiments, based on adjusting the loop gain, the loop bandwidth is substantially equal to the specified bandwidth.

Figure 5:
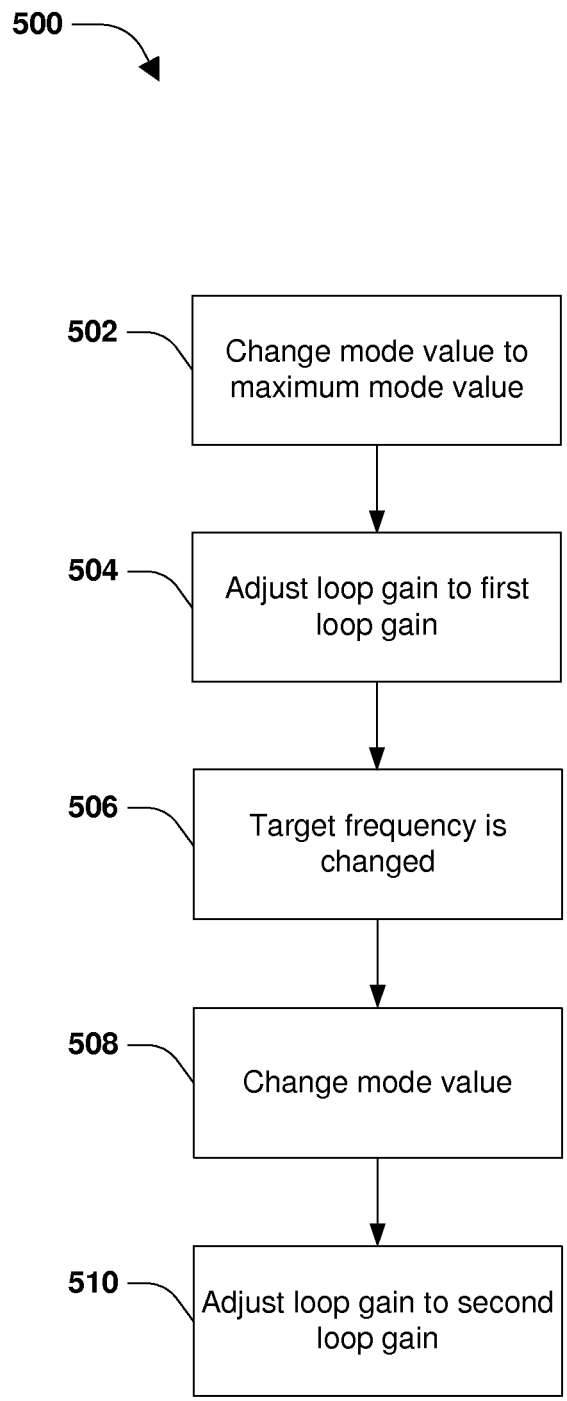
FIG. 5 illustrates a method of operating a PLL, in accordance with some embodiments.

A method 500 of operating a PLL is illustrated in FIG. 5, according to some embodiments. In some embodiments, the PLL is phase-locked and a mode value is below a maximum mode value. In some embodiments, if the mode value is the maximum mode value, a modified frequency of a modified clock signal is substantially equal to a minimum modified frequency of the modified clock signal. In some embodiments, the minimum modified frequency corresponds to an initial frequency of an initial clock signal divided by 2 to the power of the maximum mode value. In some embodiments, the minimum modified frequency is equal to the initial frequency of the initial clock signal divided by 2 to the power of the maximum mode value.

In some embodiments, a power usage of the PLL is a function of the modified frequency. In some embodiments, as the modified frequency decreases the power usage decreases. In this way, in some embodiments, at 502, the mode value is changed to the maximum mode value to decrease the power usage. In some embodiments, responsive to the mode value changing at 502, a normalized OTW is adjusted by a normalizer. In some embodiments, based on adjusting the normalized OTW by the normalizer, a loop bandwidth is substantially equal to a specified bandwidth. In some embodiments, responsive to the mode value changing at 502, a loop gain is adjusted to a first loop gain at 504. In some embodiments, based on adjusting the loop gain, the loop bandwidth is substantially equal to the specified bandwidth.

In some embodiments, at 506, a change of an FCW occurs corresponding to a change of a target frequency. In some embodiments, if the mode value is a minimum mode value, the modified frequency is equal to a maximum modified frequency of the modified clock signal. In some embodiments, the maximum modified frequency corresponds to the initial frequency divided by 2 to the power of the minimum mode value. In some embodiments, the maximum modified frequency is equal to the initial frequency divided by 2 to the power of the minimum mode value. In some embodiments, the maximum modified frequency is substantially equal to the initial frequency. In some embodiments, an acquisition time is a function of the modified frequency. In some embodiments, the acquisition time is equal to an amount of time between the change of a target frequency and the PLL being phase-locked. In some embodiments, as the modified frequency decreases the acquisition time increases. In some embodiments, as the modified frequency increases, the acquisition time decreases.

In some embodiments, at 508, responsive to the change of the target frequency, the mode value is changed to the minimum mode value to decrease the acquisition time. In some embodiments, responsive to the mode value changing at 508, the normalized OTW is adjusted by the normalizer. In some embodiments, based on adjusting the normalized OTW by the normalizer, the loop bandwidth is substantially equal to the specified bandwidth. In some embodiments, responsive to the mode value changing at 508, the loop gain is adjusted to a second loop gain at 510. In some embodiments, based on adjusting the loop gain at 510, the loop bandwidth is substantially equal to the specified bandwidth.

Figure 6:
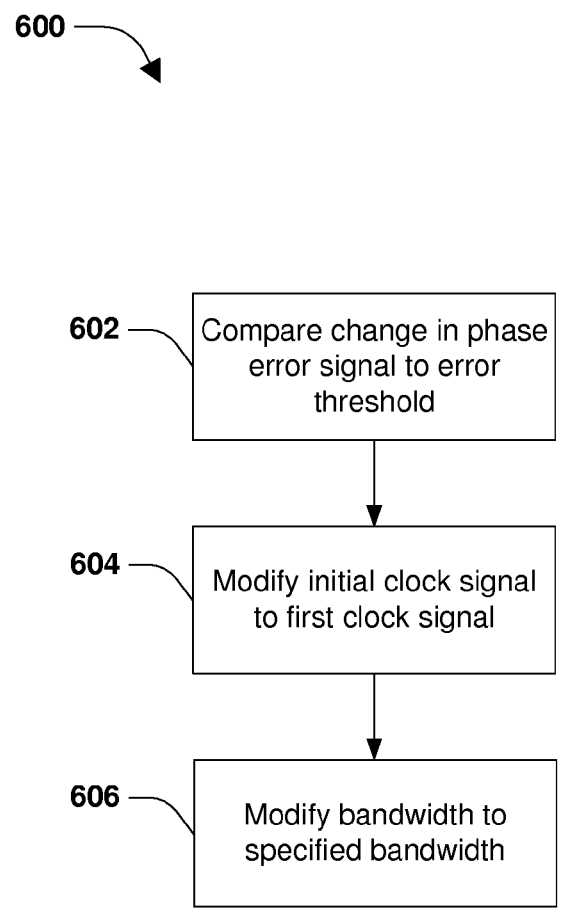
FIG. 6 illustrates a method of operating a PLL, in accordance with some embodiments.

A method 600 of operating a PLL is illustrated in FIG. 6, according to some embodiments. In some embodiments, at 602, a change in a phase error signal of the PLL is compared to an error threshold. In some embodiments, responsive to determining that the change is below the error threshold, at 604, an initial clock signal of the PLL having an initial frequency is modified to a first clock signal having a first frequency to alter power usage of the PLL. In some embodiments, the initial clock signal being modified to the first clock signal causes a bandwidth of the PLL to change from a specified bandwidth to a bandwidth different than the specified bandwidth. In some embodiments, responsive to the modifying an initial clock signal, at 606, the bandwidth is modified to the specified bandwidth.

Figure 7:
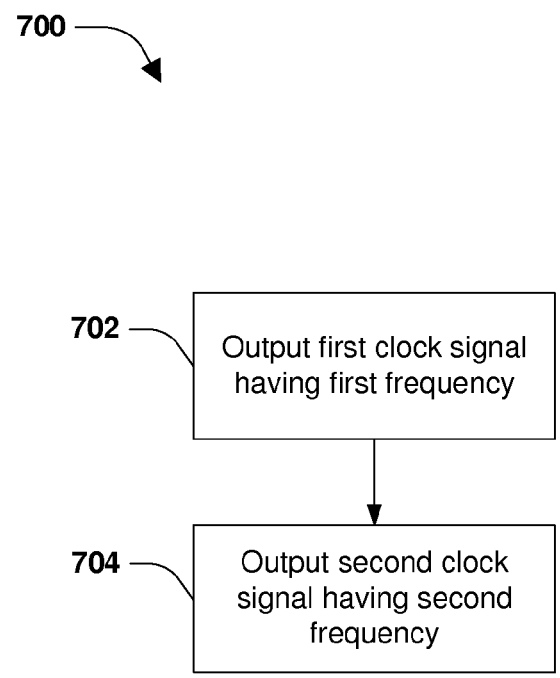
FIG. 7 illustrates a method of operating a PLL, in accordance with some embodiments.

A method 700 of operating a PLL is illustrated in FIG. 7, according to some embodiments. In some embodiments, at 702, a first clock signal having a first frequency is outputted. In some embodiments, the first clock signal is outputted by a clock adjuster. In some embodiments, responsive to determining a change of a target frequency represented by a signal, at 704, a second clock signal having a second frequency is outputted to alter an acquisition time required for the PLL to become phase-locked.

In some embodiments, a PLL is provided comprising a clock adjuster and a loop filter. In some embodiments, the clock adjuster is configured to receive an initial clock signal having an initial frequency. In some embodiments, the clock adjuster is configured to receive a mode control signal. In some embodiments, the clock adjuster is configured to modify the initial clock signal to a first clock signal based on the mode control signal, responsive to a change in a phase error signal of the PLL being below an error threshold, the first clock signal having a first frequency. In some embodiments, the loop filter is configured to generate a loop filter output signal based on the first clock signal, the loop filter output signal controlling a bandwidth of the PLL.

In some embodiments, a method for operating a PLL is provided. In some embodiments, the method comprises comparing a change in a phase error signal of the PLL to an error threshold. In some embodiments, the method comprises responsive to determining that the change is below the error threshold, modifying an initial clock signal of the PLL having an initial frequency to a first clock signal having a first frequency to alter power usage of the PLL. In some embodiments, the method comprises responsive to the modifying an initial clock signal, modifying a bandwidth of the PLL to a specified bandwidth.

In some embodiments, a method for operating a PLL is provided. In some embodiments, the method comprises outputting a first clock signal of the PLL having a first frequency. In some embodiments, the method comprises responsive to determining a change of a target frequency represented by a signal, outputting a second clock signal having a second frequency to alter an acquisition time required for the PLL to become phase-locked.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:
1. A phase-locked loop (PLL), comprising:
a clock adjuster configured to:

receive an initial clock signal having an initial frequency;

receive a mode control signal; and responsive to a change in a phase error signal of the PLL being below an error threshold, modify the initial clock signal to a first clock signal based on the mode control signal, the first clock signal having a first frequency; and a loop filter configured to generate a loop filter output signal based on the first clock signal, the loop filter output signal controlling a bandwidth of the PLL.

2. The PLL of claim 1, the loop filter configured to use the first clock signal to coordinate one or more operations.

3. The PLL of claim 1, the first frequency corresponding to the initial frequency divided by a specified divisor, the specified divisor based on the mode control signal.

4. The PLL of claim 3, the specified divisor corresponding to 2 to the power of a value of the mode control signal.

5. The PLL of claim 1, comprising a phase error circuit configured to:

receive a reference phase signal representing a reference phase;

receive a first output phase signal representing a fractional part of an output phase;

receive a second output phase signal representing an integer part of the output phase; and output the phase error signal based on at least one of the reference phase signal, the first output phase signal or the second output phase signal.

6. The PLL of claim 5, the phase error circuit comprising a subtractor configured to subtract the fractional part of the output phase and the integer part of the output phase from the reference phase to generate the phase error signal.

7. The PLL of claim 5, comprising a mode controller comprising:

a lock detection circuit configured to:
receive the phase error signal; and
provide a lock signal based on the phase error signal and the error threshold; and a finite-state machine configured to:
receive the lock signal; and
generate the mode control signal based on the lock signal.

8. The PLL of claim 7, the lock detection circuit comprising:

a flip-flop configured to generate a first signal representing a stored phase error based on the phase error signal during a previous clock cycle;

a subtractor configured to generate a second signal representing a change in a phase error of the phase error signal based on a difference between the stored phase error and the phase error; and a comparator configured to compare the change in the phase error with the error threshold to generate the lock signal.

9. The PLL of claim 1, the loop filter output signal representing an oscillator tuning word (OTW).

10. The PLL of claim 1, the loop filter configured to adjust the bandwidth to correspond to a specified bandwidth.

11. The PLL of claim 1, the loop filter configured to adjust the bandwidth based on a first bandwidth control signal.

12. The PLL of claim 11, comprising a bandwidth controller configured to generate the first bandwidth control signal based on the mode control signal.

13. The PLL of claim 12, the bandwidth controller configured to:

determine a digitally controlled oscillator (DCO) gain estimate corresponding to a gain of a DCO of the PLL; and generate a second bandwidth control signal based on the DCO gain estimate.

14. The PLL of claim 13, comprising a gain normalizer configured to:

receive the second bandwidth control signal;
receive the loop filter output signal; and
generate a normalized oscillator tuning word (OTW) signal, representing a normalized OTW, based on the second bandwidth control signal and the loop filter output signal.

15. A method for operating a phase-locked loop (PLL), comprising:

comparing a change in a phase error signal of the PLL to an error threshold;

responsive to determining that the change is below the error threshold, modifying an initial clock signal of the PLL having an initial frequency to a first clock signal having a first frequency to alter power usage of the PLL; and responsive to the modifying an initial clock signal, modifying a bandwidth of the PLL to a specified bandwidth.

16. The method of claim 15, comprising modifying an oscillator tuning word (OTW) to reduce an impact of the modifying an initial clock signal on the bandwidth.

17. The method of claim 15, comprising modifying an oscillator tuning word (OTW) of the PLL to mitigate an impact of a digitally controlled oscillator (DCO) of the PLL on the bandwidth.

18. A method for operating a phase-locked loop (PLL), comprising:

receiving an initial clock signal having an initial frequency;
receiving a mode control signal;
responsive to a change in a phase error signal of the PLL being below an error threshold, modifying the initial clock signal to generate a first clock signal having a first frequency, the first frequency corresponding to the initial frequency divided by a divisor selected based upon the mode control signal; and generating a loop filter output signal based on the first clock signal, the loop filter output signal controlling a bandwidth of the PLL.

19. The method of claim 18, the divisor corresponding to 2 to the power of a value of the mode control signal.

20. The method of claim 18, the loop filter output signal representing an oscillator tuning word (OTW).

* * * * *